(12) United States Patent
Chaichanavong et al.

(10) Patent No.: US 10,261,707 B1
(45) Date of Patent: Apr. 16, 2019

(54) DECODER MEMORY SHARING

(71) Applicant: Marvell International Ltd., Hamilton (BM)

(72) Inventors: Panu Chaichanavong, Bangkok (TH); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 72 days.

(21) Appl. No.: 15/467,839

(22) Filed: Mar. 23, 2017

Related U.S. Application Data

(60) Provisional application No. 62/312,703, filed on Mar. 24, 2016.

(51) Int. Cl.
*G06F 3/06* (2006.01)
*G06F 11/10* (2006.01)
*H03M 13/27* (2006.01)
*H03M 13/00* (2006.01)

(52) U.S. Cl.
CPC ............ *G06F 3/0619* (2013.01); *G06F 3/061* (2013.01); *G06F 3/064* (2013.01); *G06F 3/0631* (2013.01); *G06F 3/0655* (2013.01); *G06F 3/0674* (2013.01); *G06F 11/1076* (2013.01); *H03M 13/2792* (2013.01); *H03M 13/6502* (2013.01)

(58) Field of Classification Search
None
See application file for complete search history.

(56) References Cited

U.S. PATENT DOCUMENTS

| | | | | |
|---|---|---|---|---|
| 5,530,673 A | * | 6/1996 | Tobita | G06F 3/0601 365/185.04 |
| 6,219,728 B1 | * | 4/2001 | Yin | H04L 12/5601 370/229 |
| 9,317,427 B2 | * | 4/2016 | DeSota | G06F 12/0646 |
| 2005/0008011 A1 | * | 1/2005 | Georgiou | H04L 49/90 370/389 |
| 2005/0066227 A1 | * | 3/2005 | Chia | G06F 12/023 714/6.13 |
| 2007/0002612 A1 | * | 1/2007 | Chang | G06F 3/0608 365/185.01 |
| 2011/0179248 A1 | * | 7/2011 | Lee | G06F 13/364 711/171 |
| 2015/0089317 A1 | * | 3/2015 | Patapoutian | H03M 13/353 714/755 |
| 2017/0017548 A1 | * | 1/2017 | Han | G06F 11/1076 |

* cited by examiner

*Primary Examiner* — Steve N Nguyen

(57) ABSTRACT

Systems and techniques relating to decoder memory management are described. A described system includes a decoder system configured to perform decoder processes in order to decode signals generated by reading a storage medium, the decoder processes being associated with respective memory thresholds; and a memory structure coupled with the decoder system. The decoder processes use the memory structure in accordance with the respective memory thresholds. The decoder system can be configured to detect whether the memory structure is underutilized by a process of the decoder processes, determine an underutilization amount associated with the process with respect to the memory threshold of the process, identify a target decoder process of the decoder processes, and enable the target decoder process to exceed the memory threshold of the target decoder process based on the underutilization amount. Enabling the target decoder process to exceed can increase decoding performance of the target decoder process.

16 Claims, 12 Drawing Sheets

DECODER MEMORY SHARING

CROSS REFERENCE TO RELATED APPLICATIONS

This present disclosure claims the benefit of the priority of U.S. Provisional Application Ser. No. 62/312,703, filed Mar. 24, 2016, and entitled "Decoder Memory Sharing," which is incorporated herein by reference in its entirety.

BACKGROUND

This disclosure relates to decoder memory management.

Storage devices, such as a magnetic medium based disk drive or optical disk drive, can store data on circular, concentric tracks on a disk surface. A disk drive uses one or more clock signals for drive operations such as read and write operations. In some implementations, a drive head, in the disk drive, retrieves and records data on a rotating disk as the head flies on a cushion of air over the disk surface. When retrieving data from a medium, magnetic field variations or optical variations are converted into an analog electrical signal, the analog signal is amplified, converted to a digital signal, and interpreted. A storage device can use a decoder to transform the digital signal into a sequence of binary values. In some implementations, a storage device can use an error-correction code (ECC) to detect and correct errors within a read signal.

SUMMARY

The present disclosure includes systems and techniques for decoder memory management. According to an aspect of the present disclosure, a technique for decoder memory management includes performing decoder processes in order to decode signals generated by reading a storage medium, the decoder processes being associated with respective memory thresholds, the decoder processes using a memory structure in accordance with the respective memory thresholds; detecting whether the memory structure is underutilized by a process of the decoder processes; determining an underutilization amount associated with the process with respect to the memory threshold of the process; identifying a target decoder process of the decoder processes; and enabling the target decoder process to exceed the memory threshold of the target decoder process based on the underutilization amount. Enabling the target decoder process to exceed the memory threshold of the target decoder process can increase decoding performance of the target decoder process.

This and other implementations can include one or more of the following features. Implementations can include operating a sector-based error-correcting code decoder to produce first output sectors. A storage size for the first output sectors can be controlled by a first memory threshold of the memory thresholds. Implementations can include operating a track-based error-correcting code decoder to produce second output sectors. A storage size for the second output sectors can be controlled by a second memory threshold of the memory thresholds. The memory structure can include a shared output memory that stores the first output sectors and the second output sectors. The memory structure can include a shared input memory that stores input sectors and failed codewords. A storage size for the input sectors can be controlled by a third memory threshold of the memory thresholds. A storage size for the failed codewords can be controlled by a fourth memory threshold of the memory thresholds. Implementations can include operating the sector-based error-correcting code decoder to retrieve an input sector from the shared input memory; and operating the track-based error-correcting code decoder to retrieve a failed codeword from the shared input memory.

Implementations can include operating an interleaver configured to reassemble a sector that is interleaved with one or more other sectors; operating a sector-based error-correcting code decoder to correct one or more errors of the sector based on parity data contained within the sector; and operating a track-based error-correcting code decoder to correct one or more errors within a group of sectors based on group parity data. Implementations can include reassigning unused memory associated with the interleaver to the sector-based error-correcting code decoder, the track-based error-correcting code decoder, or both.

The memory structure can include a shared input memory that stores input sectors and failed codewords. A storage size for the input sectors can be controlled by a first memory threshold of the memory thresholds. A storage size for the failed codewords can be controlled by a second memory threshold of the memory thresholds. Implementations can include dynamically sharing memory within the shared input memory between storage for the input sectors and storage for the failed codewords. In some implementations, the memory structure can include banks. A memory threshold can represent an assigned number of the banks. In some implementations, an underutilization amount represents a number of the banks that are free to be reassigned.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, one or more disclosed embodiments can be implemented in various systems and apparatus, including, but not limited to, a special purpose data processing apparatus (e.g., a remote environment monitor, a router, a switch, a computer system component, a medium access unit), an automotive communication system, a mobile computer, a digital camera, a general purpose data processing apparatus such as a computer, or combinations of these.

A decoding device can include a decoder system configured to perform decoder processes in order to decode signals generated by reading a storage medium, each decoder process of the decoder processes being associated with a respective memory threshold; and a memory structure coupled with the decoder system, the decoder processes using the memory structure in accordance with the respective memory thresholds. The decoder system can be configured to detect whether the memory structure is underutilized by a process of the decoder processes, determine an underutilization amount associated with the process with respect to the memory threshold of the process, identify a target decoder process of the decoder processes, and enable the target decoder process to exceed the memory threshold of the target decoder process based on the underutilization amount. Enabling the target decoder process to exceed the memory threshold of the target decoder process can increase decoding performance of the target decoder process.

The decoder system can include a sector-based error-correcting code decoder that produces first output sectors and a track-based error-correcting code decoder that produces second output sectors. The memory structure can include a shared output memory that stores the first output sectors and the second output sectors. In some implementations, a storage size for the first output sectors is controlled by a first memory threshold of the memory thresholds, and a storage size for the second output sectors is controlled by a second memory threshold of the memory thresholds. In some implementations, the memory structure can include a shared input memory that stores input sectors and failed codewords. In some implementations, a storage size for the input sectors is controlled by a third memory threshold of the memory thresholds, and a storage size for the failed codewords is controlled by a fourth memory threshold of the memory thresholds. In some implementations, the sector-based error-correcting code decoder is configured to retrieve an input sector from the shared input memory, and the track-based error-correcting code decoder is configured to retrieve a failed codeword from the shared input memory.

In some implementations, the decoder system can include an interleaver configured to reassemble a sector that is interleaved with one or more other sectors; a sector-based error-correcting code decoder that is configured to correct one or more errors of the sector based on parity data contained within the sector; and a track-based error-correcting code decoder that is configured to correct one or more errors within a group of sectors based on group parity data. In some implementations, the decoder system is configured to reassign unused memory associated with the interleaver to the sector-based error-correcting code decoder, the track-based error-correcting code decoder, or both. In some implementations, the memory structure can include a shared input memory that stores input sectors and failed codewords. In some implementations, a storage size for the input sectors is controlled by a first memory threshold of the memory thresholds, and a storage size for the failed codewords is controlled by a second memory threshold of the memory thresholds. In some implementations, the decoder system is configured to dynamically share memory within the shared input memory between storage for the input sectors and storage for the failed codewords. In some implementations, the decoder system and the memory structure are integrated on a single integrated circuit.

Particular configurations of the technology described in this disclosure can be implemented so as to realize one or more of the following potential advantages. A described technology can allow underutilized memory from one decoder process to be shifted to another decoder process to increase that process's decoding performance. A described technology can allow underutilized memory to be redistributed either statically or dynamically. Increasing overall decoder memory utilization can reduce a need to add additional memory to an existing system architecture while at the same time increasing overall decoding performance.

Details of one or more implementations are set forth in the accompanying drawings and the description below. Other features and advantages may be apparent from the description and drawings, and from the claims.

DRAWING DESCRIPTIONS

Figure 5A:
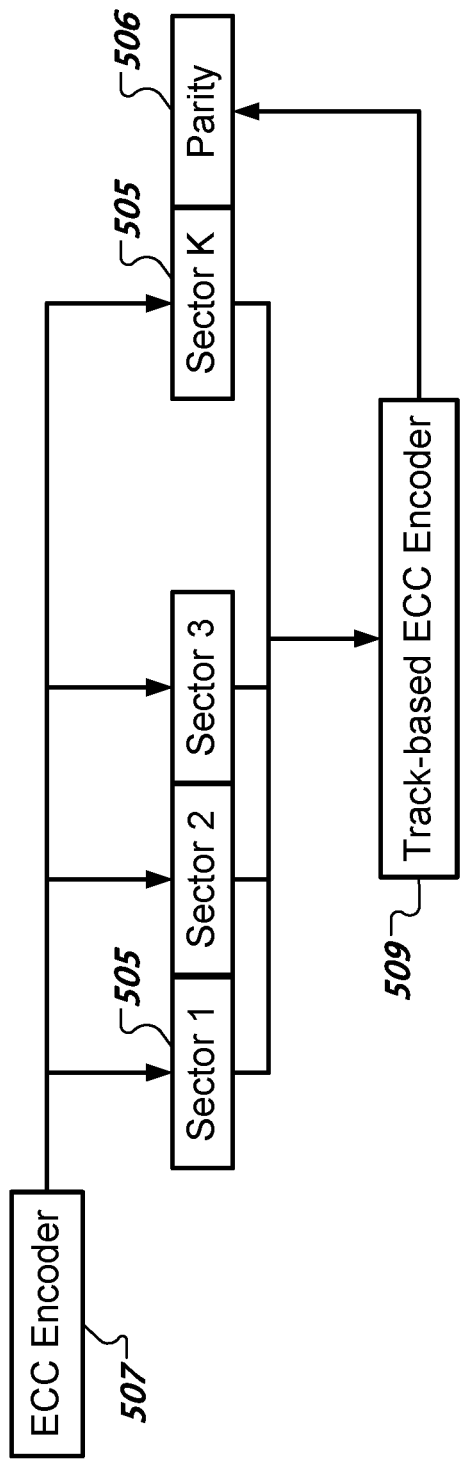
Figure 5B:
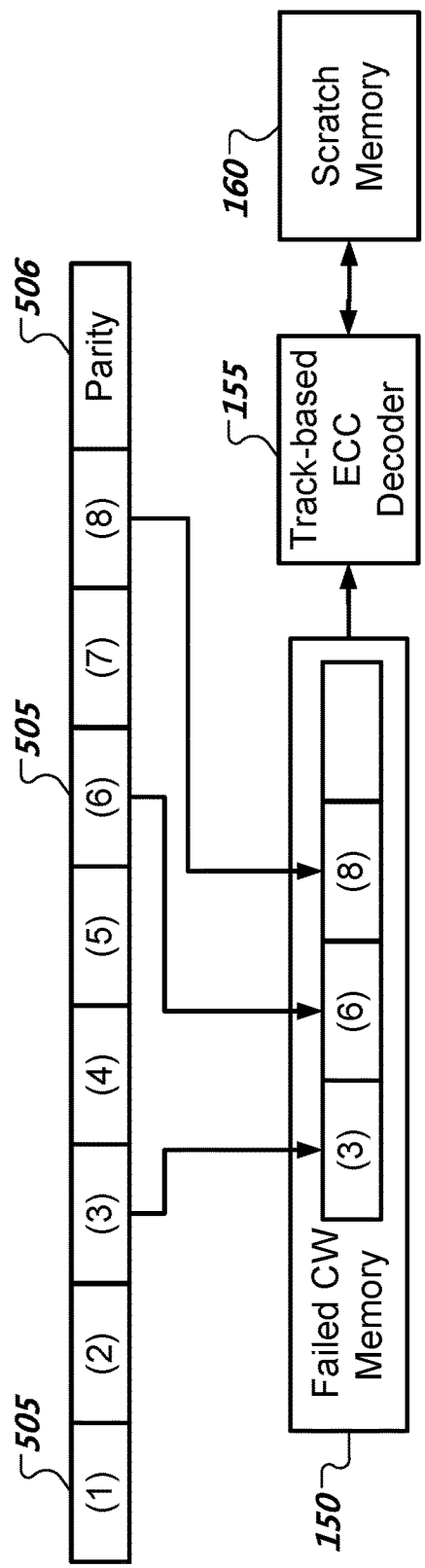
Figure 5C:
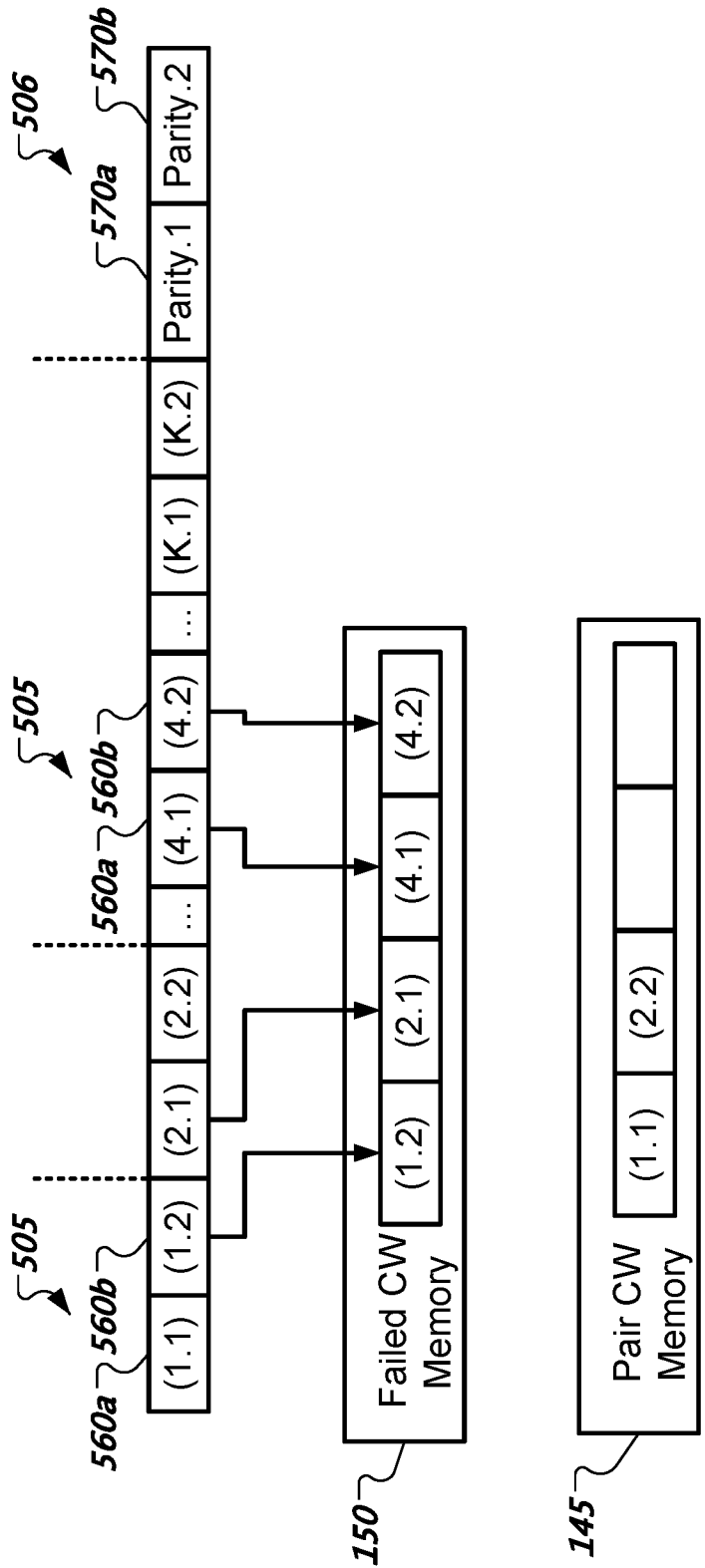

FIG. 5A shows an architecture of an example of an ECC encoder coupled with a track-based ECC encoder. FIG. 5B shows an architecture of an example of a track-based ECC decoder. FIG. 5C shows an architecture of an example of a track-based ECC decoder that operates on sectors that each have two or more ECC codewords.

Figure 6:
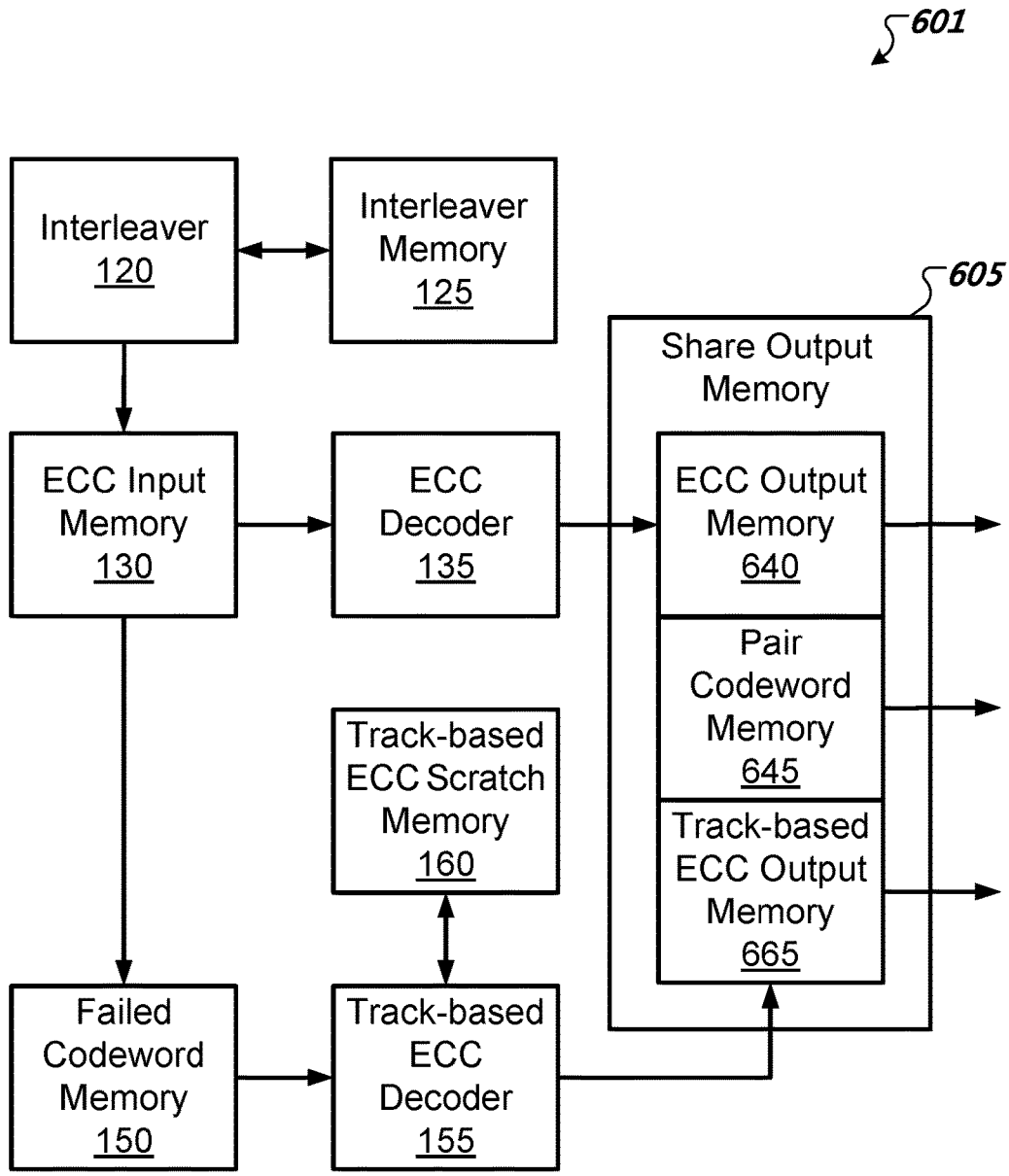

FIG. 6 shows an architecture of an example of a decoder system that dynamically shares memory among different types of output memories.

Figure 7:
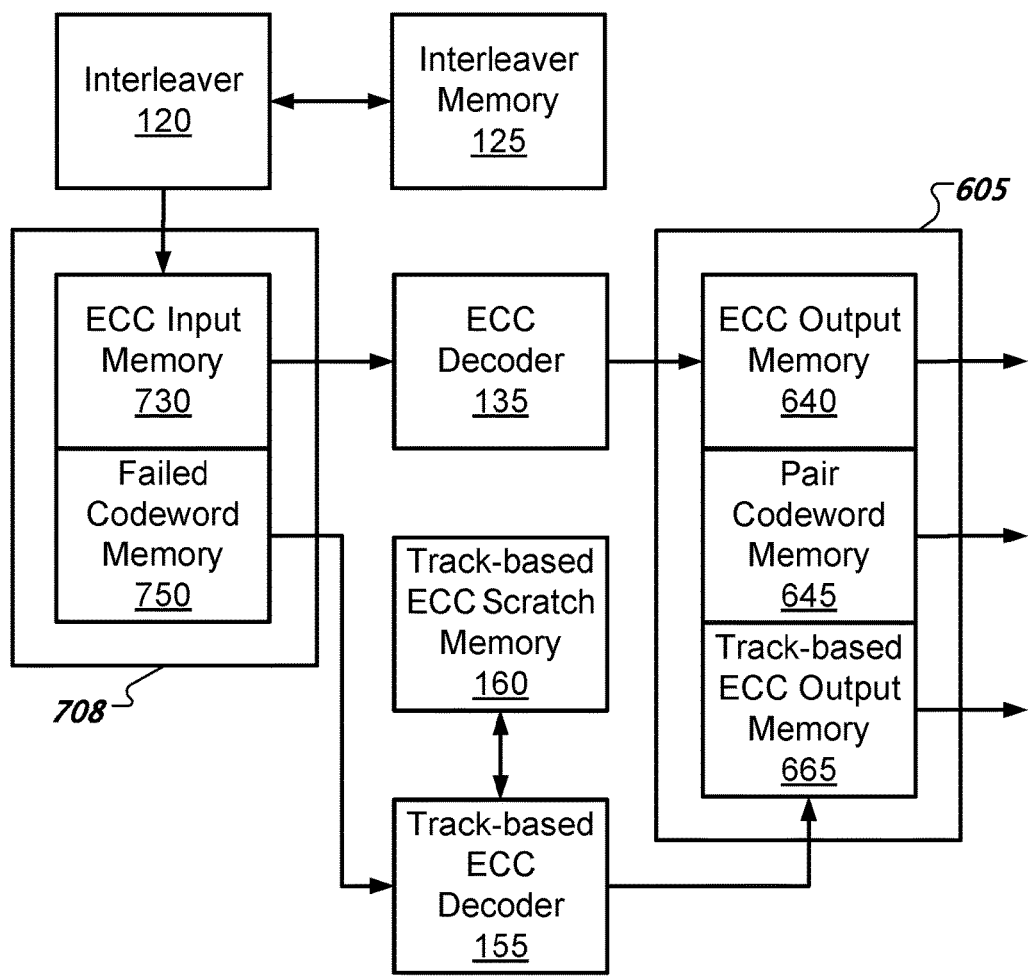

FIG. 7 shows an architecture of an example of a decoder system that dynamically shares memory among different types of input memories and dynamically shares memory among different types of output memories.

Figure 8:
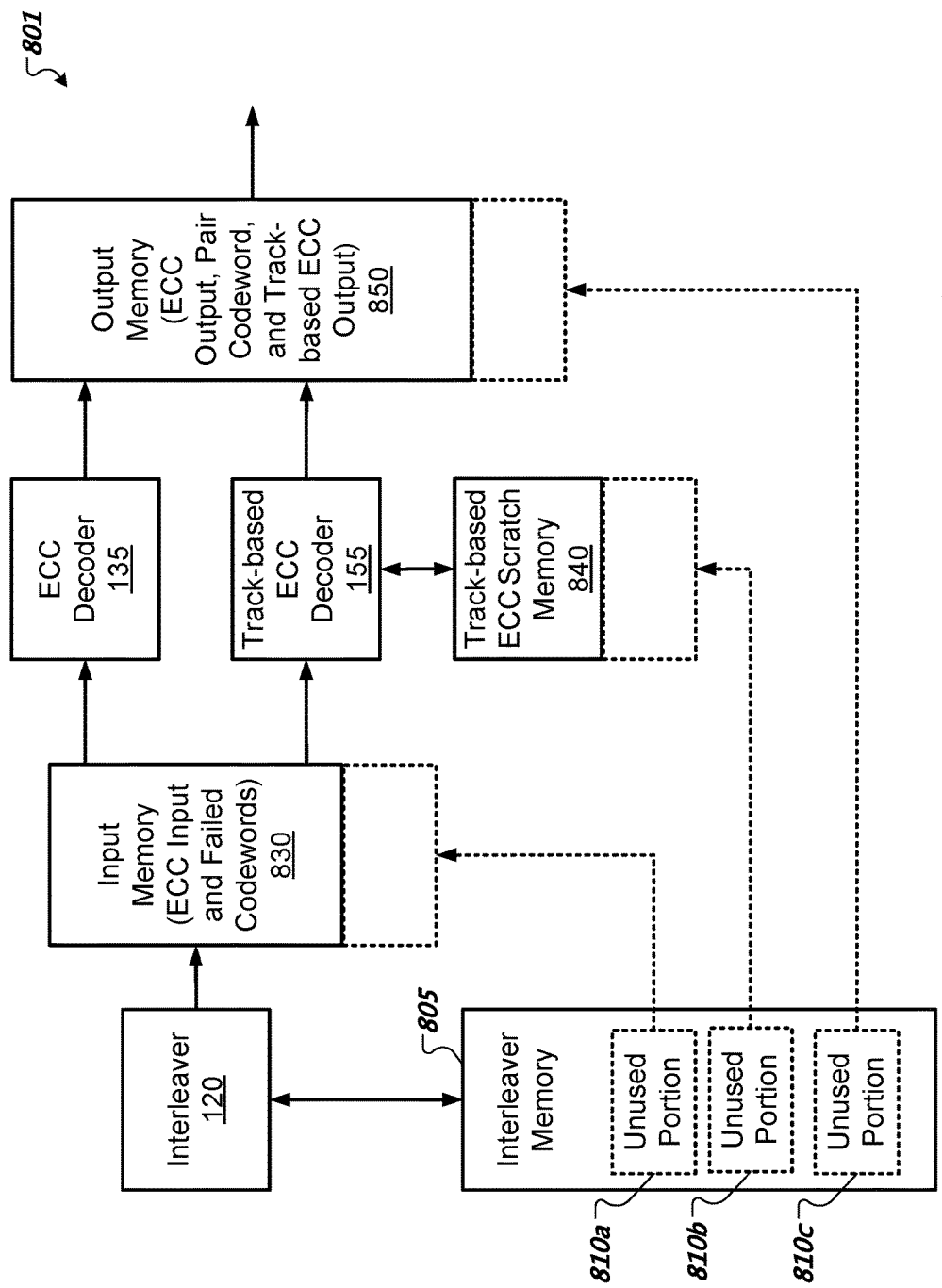

FIG. 8 shows an architecture of an example of a decoder system that allocates unused memory from an interleaver memory to other types of memories.

Figure 9:
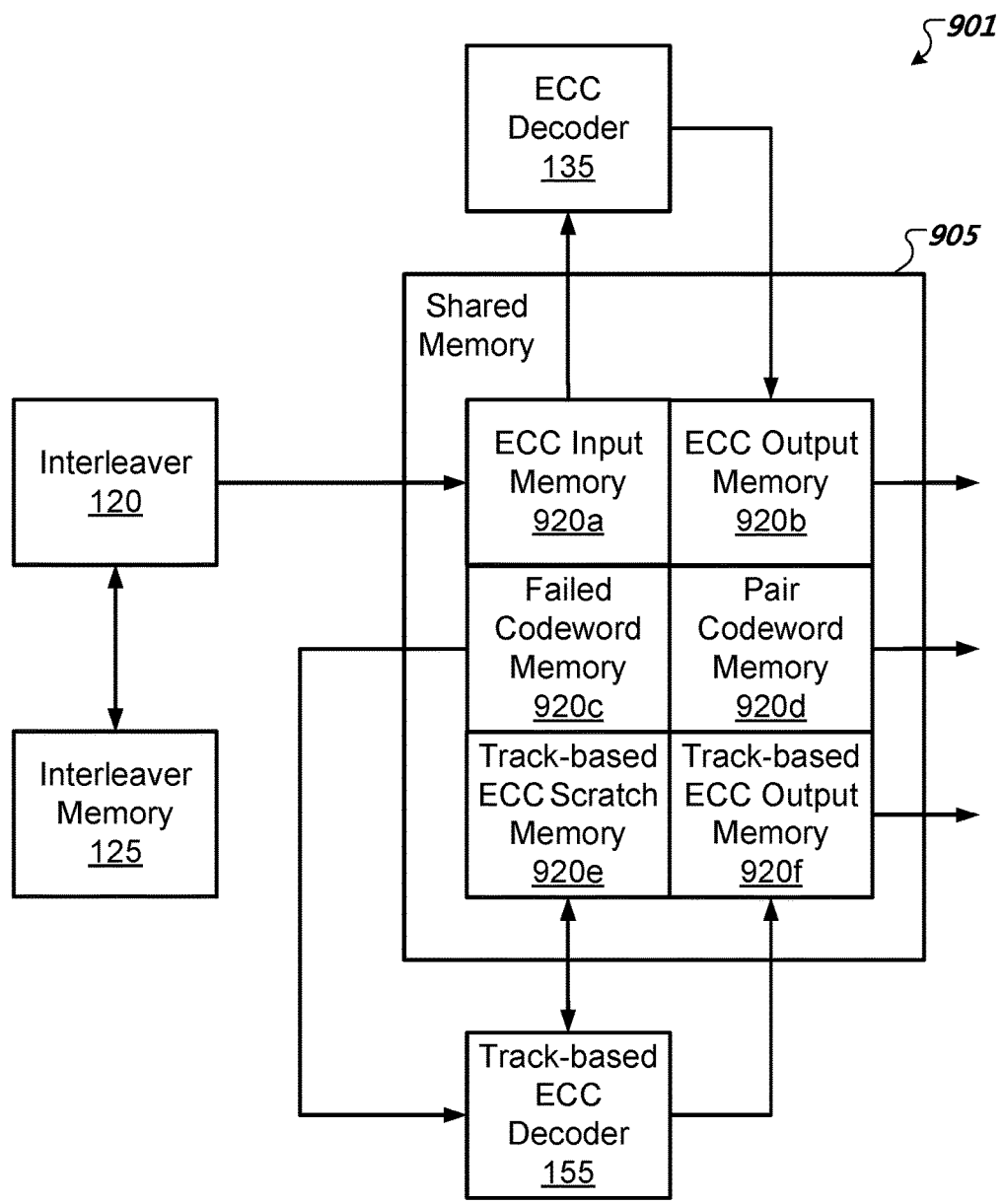

FIG. 9 shows an architecture of an example of a decoder system that includes a shared memory.

Figure 10:
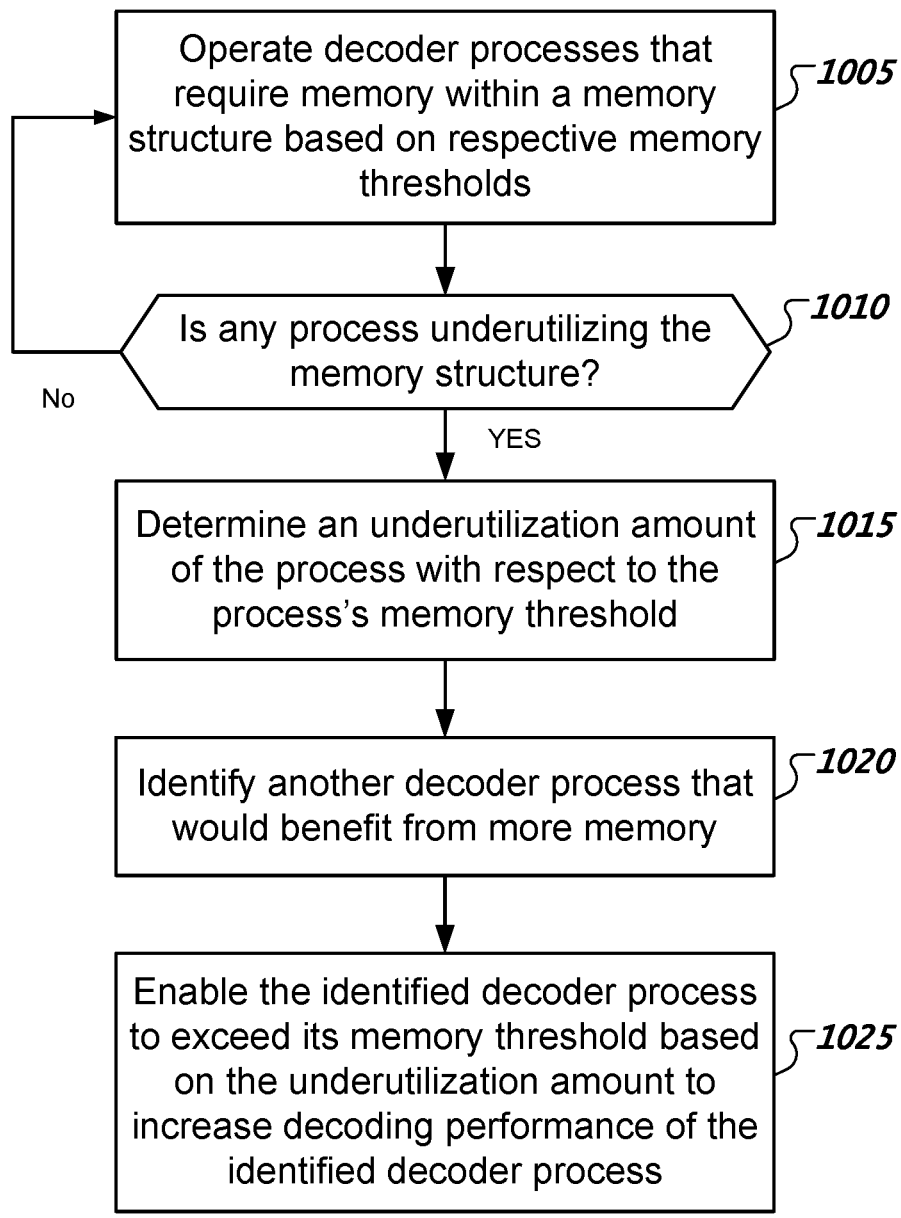

FIG. 10 shows a flowchart of an example of operations performed by a controller of a storage system.

Like reference symbols in the various drawings indicate like elements.

DETAILED DESCRIPTION

Figure 1:
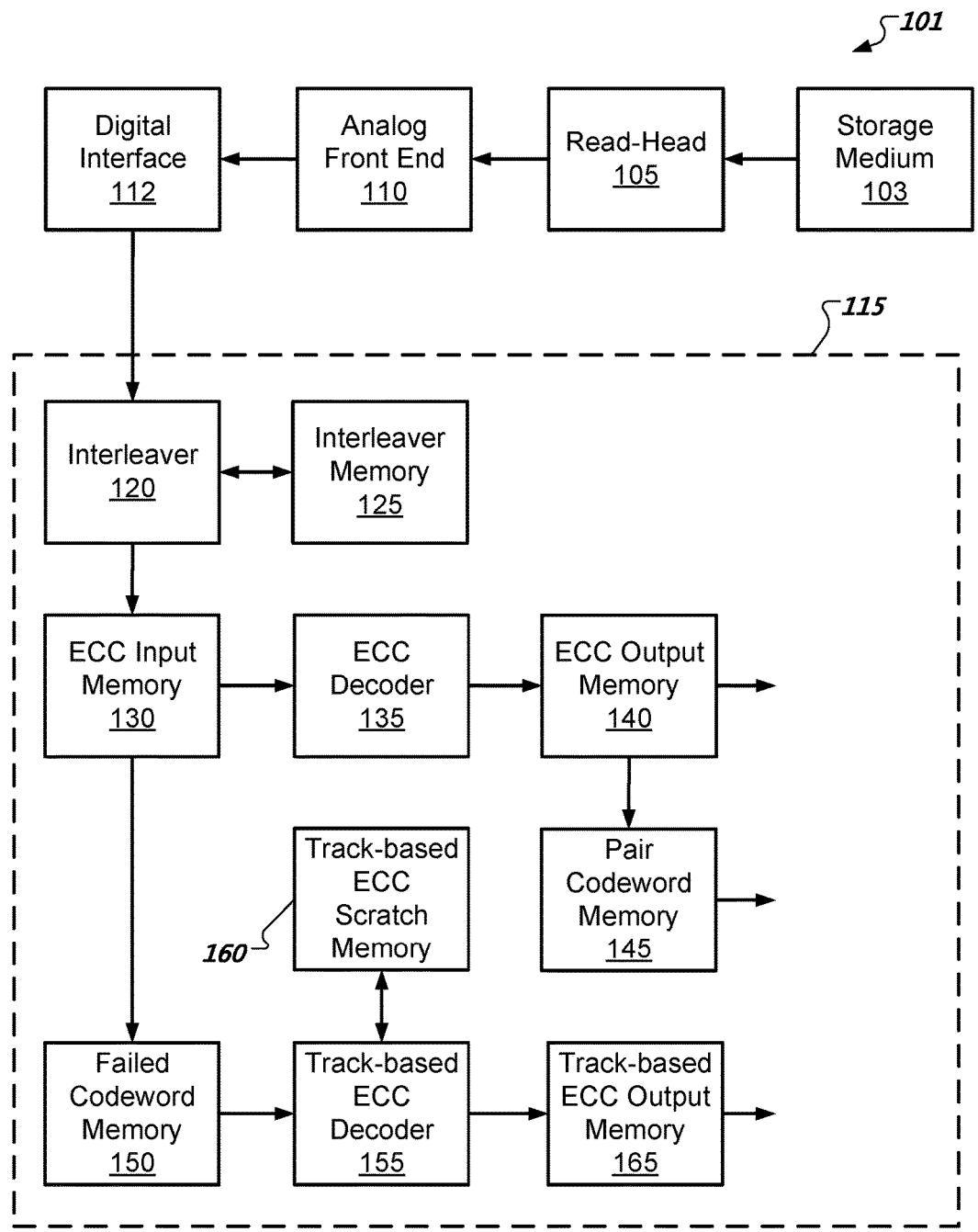
FIG. 1 shows a read-side architecture of an example of a storage system.

FIG. 1 shows a read-side architecture of an example of a storage system 101. The storage system 101 includes a storage medium 103, read-head 105, analog front end 110, digital interface 112, and iterative decoder 115. Various examples of the storage medium 103 include a magnetic medium or an optical medium. However, the disclosed decoding techniques can be applied to any suitable storage medium or communication medium. In some implementations, the analog front end 110 includes components such as an amplifier, equalizer, and an analog-to-digital converter (ADC).

The storage system 101 in this example is configured to use various techniques to increase the likelihood of successful decoding of sectors stored on the storage medium 103. The storage system 101 can use sector interleaving to ameliorate degradation or corruption within a read signal. The iterative decoder 115 can use an iteration-on-demand technique, e.g., a nominal ECC technique, to recover a corrupt sector by decoding a sector multiple times with successive changes to data within the sector based on a sector's ECC. The iterative decoder 115 can queue sectors since iteration-on-demand can require a variable amount of time. This amount of time is typically proportional to a number of decode attempts. The iterative decoder 115 can use a track-based ECC technique to recover a corrupt sector if the sector fails the iteration-on-demand technique. A track-based ECC technique uses a separate ECC to protect a group of sectors. In sum, the iterative decoder 115 operates several decoder processes to output data from the storage system 101 to a host device. In some implementations, the decoder processes operate in a pipeline fashion, parallel fashion, or both.

The iterative decoder 115 includes interleaver 120 to perform an interleaver process to reverse the sector interleaver when a sector was written to the storage medium 103. The iterative decoder 115 includes ECC decoder 135 to perform an iteration-on-demand process. The iterative decoder 115 includes a track-based ECC decoder 155 which can further assist to recover a corrupt sector. The interleaver 120 uses an interleaver memory 125 to store portions of sectors for reassembly. Once all portions for a sector are stored in the interleaver memory 125, the sector can be transferred to an ECC input memory 130.

The ECC decoder 135 reads from the ECC input memory 130 and writes to an ECC output memory 140. However, if the ECC decoder 135 is not able to successfully decode a sector, the ECC decoder 135 can place the failed sector into a failed codeword memory 150. The track-based ECC decoder 155 can process failed sectors from the failed codeword memory 150 and, if successful, place decoded sectors into a track-based ECC output memory 165. The track-based ECC decoder 155 uses a track-based ECC scratch memory 160 for temporary data usage related to decoding.

In some implementations, a sector is divided into sector segments that are separately protected by an ECC, e.g., each segment is associated with its own ECC parity bits. Further, the ECC decoder 135 can store a successfully decoded sector segment in a pair codeword memory 145 in the event that the other sector segment(s) is not successfully decoded and requires further decoding by the track-based ECC decoder 155. In some implementations, interleaver memory 125, ECC input memory 130, and failed codeword memory 150 store values corresponding to a raw, or un-decoded, digital version of an analog read signal. In some implementations, the ECC output memory 140, pair codeword memory 145, and track-based ECC output memory 165 store values corresponding to a fully decoded sector, e.g., the sector's ECC has been applied and removed.

In some implementations, some or all of the memories such as interleaver memory 125, ECC input memory 130, ECC output memory 140, pair codeword memory 145, failed codeword memory 150, track-based ECC scratch memory 160, and track-based ECC output memory 165 are separate regions within a memory structure. Note that an optimal allocation within the memory structure to the memory 130, 140, 145, 150, 160, 165 may be unknown at the time of circuit design, e.g., the exact disk medium is unknown or a total memory size is unknown. Such an allocation can be determined later. For example, in some implementations, a disk drive tuning process may be used to determine an optimal allocation after manufacture of a disk drive. In some implementations, a controller can dynamically make optimal allocations during a read process. In some implementations, the storage system 101 forms a memory 130, 140, 145, 150, 160, 165 by allocating a portion of a memory structure such as a memory bank. For example, a first contiguous range of a memory structure can be allocated to the interleaver memory 125, a second contiguous range of a memory structure can be allocated to the ECC input memory 130, etc. In some implementations, noncontiguous ranges of a memory structure can be allocated to a memory 130, 140, 145, 150, 160, 165. In some implementations, the storage system 101 forms a memory 130, 140, 145, 150, 160, 165 by implementing a quota system for various decoder process. In some implementations, the storage system 101 includes a system-on-a-chip (SoC) that contains the iterative decoder 115 and one or more memory structures for memories 130, 140, 145, 150, 160, 165. In some implementations, a controller within the storage system 101 can dynamically change memory allocations or quotas to redistribute memory as appropriate.

Figure 2:
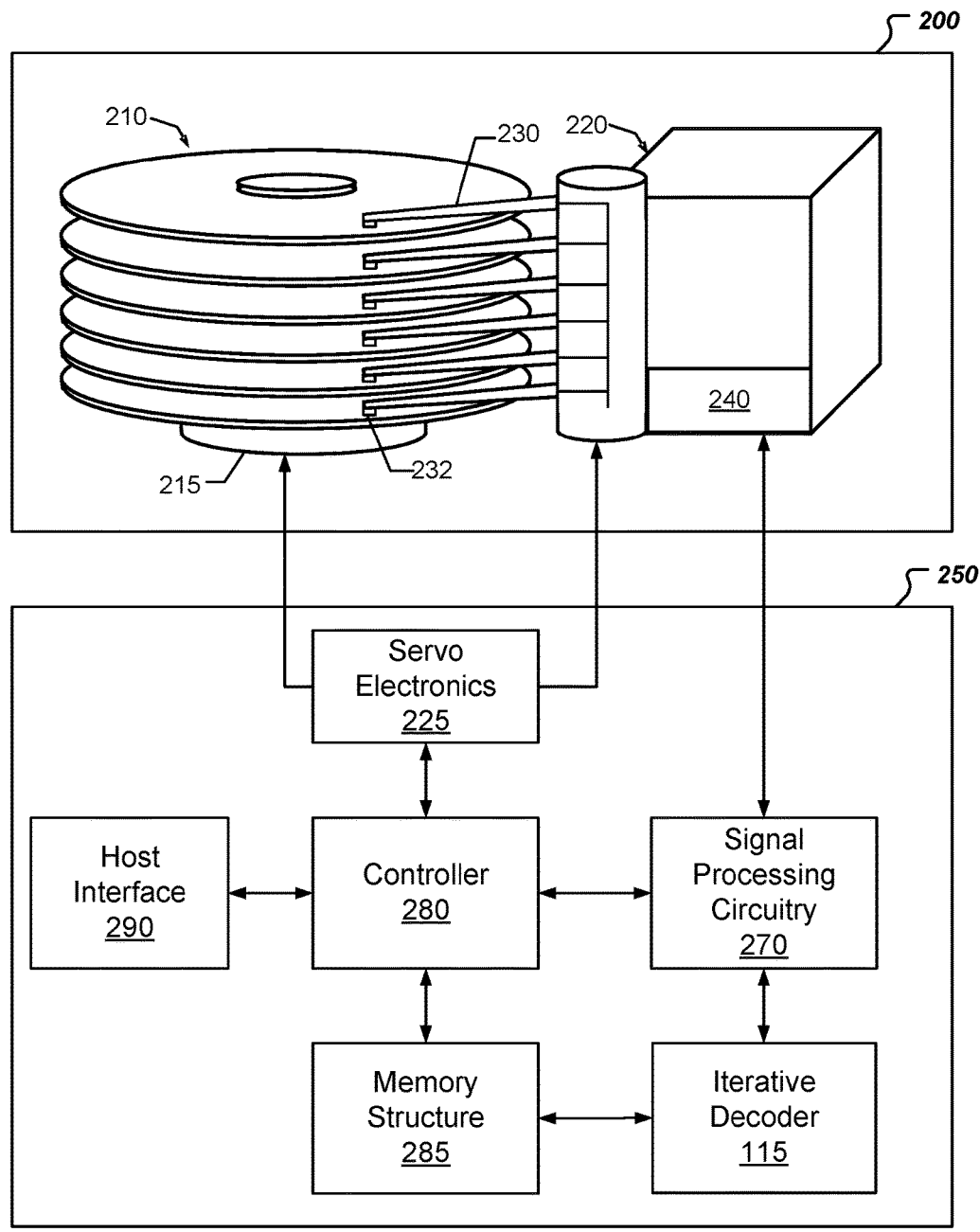
FIG. 2 shows a high-level architecture of an example of a disk drive system.

FIG. 2 shows a high-level architecture of an example of a disk drive system. The disk drive system includes a head-disk assembly (HDA) 200 and drive electronics 250 such as a printed circuit board assembly (PCBA) with semiconductor devices. The disk drive system can include a magnetic recording medium, which can include one or more disks. A disk 210 can be coated with a magnetically hard material (e.g., a particulate surface or a thin-film surface) and can be written to, or read from, a single side or both sides of each disk.

The HDA 200 includes one or more disks 210 mounted on an integrated spindle and motor assembly 215. The integrated spindle and motor assembly 215 includes a spindle motor to rotate the disks 210. The spindle and motor assembly 215 rotates the disk(s) 210 under one or more drive heads 232 that are mechanically coupled with a head assembly 220 in the HDA 200. A drive head 232 can include one or more magnetic transducers. In some implementations, a drive head 232 includes a read head and a write head. The read head and the write head can be located at different portions of the drive head 232. For example, the read head can be physically offset from the write head.

A drive head 232 on an arm 230 can be positioned as needed to read or write data on the disk 210. A motor, such as a voice coil motor (VCM), can be used to position the drive head 232 over a target track on a disk 210. The arm 230 can be a pivoting or sliding arm and can be spring-loaded to maintain a proper flying height for the drive head 232 in any drive orientation. The HDA 200 can include a preamp/writer 240, where head selection and sense current value(s) can be set. The preamp/writer 240 can amplify a read signal before outputting it to signal processing circuitry 270. Signals between the HDA 200 and drive electronics 250 can be carried through a flexible printed cable.

Drive electronics 250 can include servo electronics 225, signal processing circuitry 270, controller 280, a memory structure 285, and a host interface 290. In some implementations, the signal processing circuitry 270 includes a read signal circuit, a servo signal processing circuit, decoder circuitry, and a write signal circuit. Controller 280 can include processor electronics such as one or more processors to operate the disk drive. In some implementations, the controller 280 is configured to perform one or more techniques described herein. In some implementations, the controller 280 communicates with a memory structure 285 such as a non-volatile memory to retrieve firmware to operate processor electronics. In some implementations, controller 280 includes a storage area for computer program code and data. In some implementations, controller 280 includes at least a portion of the signal processing circuitry 270.

The controller 280 can be communicatively coupled with an external processor or data bus via the host interface 290 to receive read/write instructions, receive data to write to disk(s) 210, and transmit data read from one or more disks 210. In some implementations, the controller 280 can independently perform a retry process that does not involve a host connected via the host interface 290. Controller 280 can direct servo electronics 225 to control mechanical operations, such as head positioning through the head assembly 220 and rotational speed control through the motor assembly 215. In some implementations, the controller 280 can be integrated with the servo electronics 225, signal processing circuitry 270, or both. One or more portions of the drive electronics 250 can be implemented as a single integrated circuit.

The signal processing circuitry 270 is coupled with a decoder such as the iterative decoder 115 depicted by FIG. 1. In some implementations, the signal processing circuitry 270 includes the iterative decoder 115. In some implementations, the iterative decoder 115 can read data from and write data to the memory structure 285. For example, the memory structure 285 can store data such as codeword samples produced by the signal processing circuitry 270. In some implementations, the signal processing circuitry 270 includes a memory structure that stores codeword samples. In some implementations, memories associated with the iterative decoder 115 such as interleaver memory 125, ECC input memory 130, ECC output memory 140, pair codeword memory 145, failed codeword memory 150, track-based ECC scratch memory 160, and track-based ECC output memory 165 can be separate regions within the memory structure 285.

Figure 3:
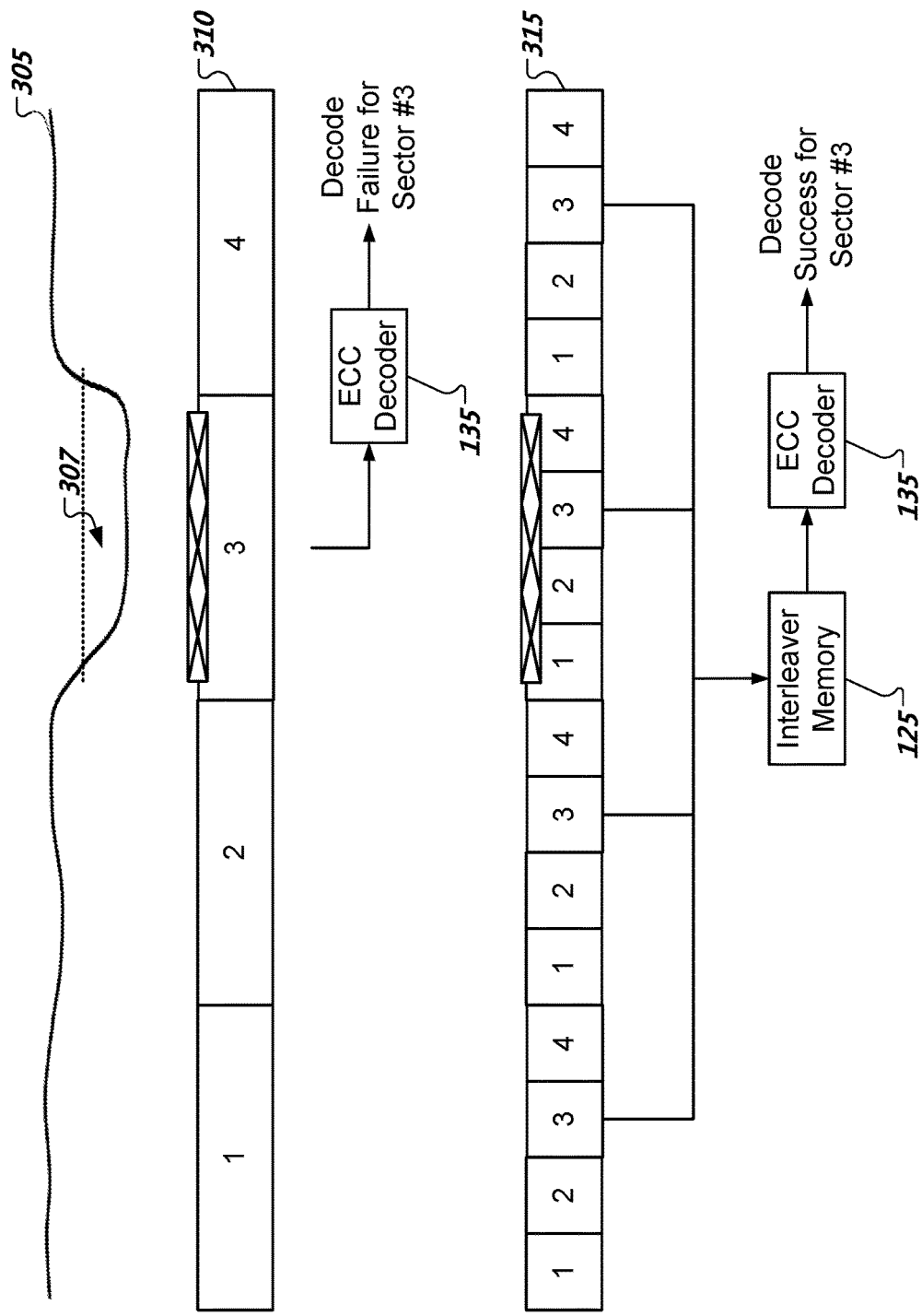
FIG. 3 shows an example of the advantages of sector interleaving.

FIG. 3 shows an example of the advantages of sector interleaving. A waveform 305 produced by a read-head depicts a drop 307 in a Signal-to-Noise Ratio (SNR). In this example, the drop 307 in SNR corresponds to sector 3 of a non-interleaved group of sectors 310. Further, the drop 307 in SNR is sufficient to cause a decode failure in ECC decoder 135. Based on sector interleaving, the drop 307 in SNR corresponds to portions of sectors 1-4 of an interleaved group of sectors 315. Sector interleaving aims to combat SNR variation in the channel. Sector interleaving writes a portion of a sector at a time, and accordingly spreads out a sector and interleaves portions of the sector with portions from other sectors. Thus, a bad SNR region (see SNR drop 307), impacts a small fraction of a sector rather than a whole sector. The ECC decoder 135 is more likely to recover interleaved sectors since the bad SNR region is dispersed across many sectors instead of one. As noted above, an interleaver memory 125 is used to assemble the portions of the sectors into a complete sector before passing the sector data to the ECC decoder 135.

Interleaving more sectors at a time is generally better such that a bad SNR region can be spread across more interleaved sectors. The interleaver memory 125 stores N sectors at a time, where N is the number of interleaved sectors. However, depending on a SNR variation profile, sector interleaving may help up to a certain number N. For example, if performance returns diminish after interleaving eight sectors, then interleaving more than eight would waste memory within the interleaver memory 125. In some implementations, a drive controller can perform a test to determine a suitable value for N during an initialization procedure.

Figure 4A:
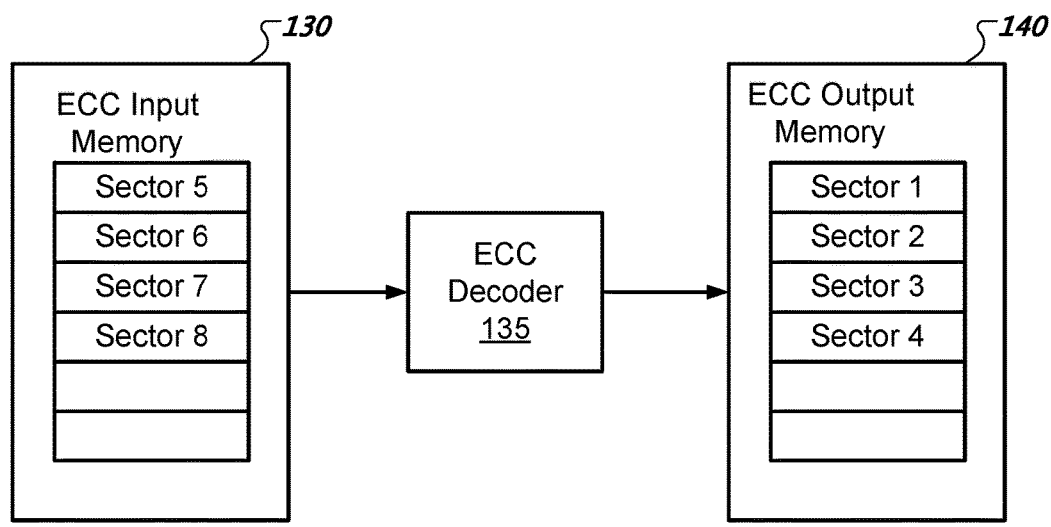
FIG. 4A shows an arrangement of memory associated with an iteration-on-demand capability of an ECC decoder.
Figure 4B:
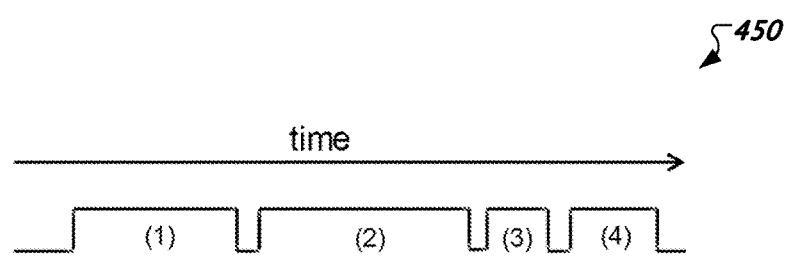
FIG. 4B shows a timing diagram associated with the ECC decoder.

FIG. 4A shows an arrangement of memories associated with an iteration-on-demand capability of an ECC decoder 135. FIG. 4B shows a timing diagram 450 associated with the ECC decoder 135. The ECC decoder 135 can retrieve an input sector from the ECC input memory 130, perform ECC decoding, and place the corresponding decoding output in ECC output memory 140. The ECC decoder 135 is dynamically iterative in nature. As such, the ECC decoder 135 can take different amounts of time to decode different sectors. ECC input memory 130 is used to deal with queuing and buffering sectors when a sector takes a long time to decode. ECC output memory 140 can buffer sectors when the ECC decoder 135 finishes several sectors in short amount of time.

As depicted in FIG. 4B, sectors 1, 2, 3, and 4 require different amounts of time for decoding. Sector 3 takes the least amount of time, e.g., the SNR is high and the ECC decoder 135 is able to successfully decode sector 3 in one iteration. Sector 2 takes the most time, e.g., the SNR is low for several portions of the sector and the ECC decoder 135 requires many iterations to decode sector 2. In some implementations, the ECC decoder 135 has a pre-set number of iterations before the ECC decoder 135 declares a sector decode failure, at which point another decoder process can try to recover the sector.

FIG. 5A shows an architecture of an example of an ECC encoder 507 coupled with a track-based ECC encoder 509. The ECC encoder 507 encodes a data portion of each sector 505 (labelled 1 through K) using ECC to generate respective ECC portions of the sectors 505. In some implementations, the sectors 505 belong to the same track. The track-based ECC encoder 509 generates a parity sector 506 based on the sectors 505. In this example, the parity sector 506 is appended to the end of the sectors 505.

FIG. 5B shows an architecture of an example of a track-based ECC decoder 155. During normal ECC decoding by ECC decoder 135, when a sector fails, the decoder input is transferred to a failed codeword (CW) memory 150. In this example, sectors 3, 6, and 8 have failed the individual ECC checks put in place by the ECC encoder 507. After all sectors within a track-based ECC group are decoded by an ECC decoder 135, a track-based ECC decoder 155 can start to recover any failed sector. The size of failed codeword memory 150 controls a maximum number of sector failures that the track-based ECC decoder 155 can recover during a period. The track-based ECC decoder 155 uses a scratch memory 160 during a recovery process. The size of the scratch memory 160 can be based on the number of failed sectors. In some implementations, the scratch memory 160 can accumulate parity information of the successfully decoded sectors to speed the process of recovering the failed sectors.

FIG. 5C shows an architecture of an example of a track-based ECC decoder 155 that operates on sectors 505 that each have two or more ECC codewords 560a-b. In this example, there are multiple ECC codewords 560a-b within a sector 505. The track-based parity 506 exists in this example, however, it is split into a first parity set 570a and a second parity set 570b, where the first parity set 570a covers the first ECC codewords 560a of the sectors 505, and the second parity set 570b covers the second ECC codewords 560b of the sectors 505.

There could be some sectors 505, that after ECC decoding, have a failed codeword and a successful codeword (e.g., codeword 560a fails, whereas codeword 560b succeeds). In this case, decoded binary data of a successful codeword (see, e.g., sectors codewords 1.1 and 2.2) are kept in a pair codeword memory 145. Decoder input for the failed codeword (see, e.g., sectors codewords 1.2 and 2.1) is kept in a failed codeword memory 150. When the track-based ECC decoder 155 recovers a failed codeword, data of the entire sector (e.g., both codewords 560a-b) can be sent out together via transferring data from the pair codeword memory 145 and the output of the track-based ECC decoder 155. Note that if both codewords 560a-b of a sector 505 fail, then both are placed in the failed codeword memory 150 for processing by the track-based ECC decoder 155.

FIG. 6 shows an architecture of an example of a decoder system 601 that dynamically shares memory among different types of output memories 640, 645, and 665. The decoder system 601 includes interleaver 120, interleaver memory 125, ECC input memory 130, ECC decoder 135, failed codeword memory 150, track-based ECC decoder 155, track-based ECC scratch memory 160, and a shared output memory 605. In this example, the output memories (including ECC output memory 640, pair codeword memory 645, track-based ECC output memory 665) utilize the same resource, collectively called shared output memory 605. In some implementations, the shared output memory 605 is stored in a separate memory bank or in a separate memory structure from other memories such as interleaver memory 125, ECC input memory 130, and failed codeword memory 150.

The decoder system 601 can control a storage size of each memory 640, 645, 665 within the shared output memory 605 based on respective memory thresholds. A memory threshold can represent a predetermined maximum memory allocation. For example, a memory threshold of 32K indicates that an associated decoder process can only use 32K worth of memory within a memory structure. In some implementations, a memory threshold corresponds to an assigned number of banks within a memory structure. However, the decoder system 601 can be configured to dynamically share the shared output memory 605 among the ECC output memory 640, pair codeword memory 645, and track-based ECC output memory 665 during run-time. For example, if there are not many pair codewords stored in the pair codeword memory 645, the decoder system 601 can automatically allocate more memory to the ECC output memory 640. Allocating more memory can include increasing a memory threshold, e.g., from 32K to 64K.

In some implementations, the decoder system 601 detects that the ECC output memory 640 is full based on a predetermined threshold and determines whether to allocate more memory to the ECC output memory 640 based on whether the pair codeword memory 645 is being underutilized, the track-based ECC output memory 665 is being underutilized, or both. In some implementations, a memory is deemed underutilized if current usage of the memory is less than the associated memory threshold by a configurable amount. For example, if only 16K of a 32K allocation is used within a memory, the remaining 16K or a portion thereof may redistributed to another memory.

FIG. 7 shows an architecture of an example of a decoder system 701 that dynamically shares memory among different types of input memories 730, 750 and dynamically shares memory among different types of output memories 640, 645, and 665. The decoder system 701 includes interleaver 120, interleaver memory 125, shared input memory 708, ECC decoder 135, track-based ECC decoder 155, track-based ECC scratch memory 160, and shared output memory 605. In this example, the input memories (including ECC input memory 730 and failed codeword memory 750) utilize the same resource, collectively called shared input memory 708. The output memories (including ECC output memory 640, pair codeword memory 645, track-based ECC output memory 665) utilize the same resource, collectively called shared output memory 605. The shared input memory 708 and the shared output memory 605, in some implementations, reside in physically separate memory structures. In some implementations, the shared input memory 708 and the shared output memory 605 reside in the same memory structures.

The decoder system 701 in this example manages the shared input memory 708 separately from the shared output memory 605. The decoder system 701 is configured to dynamically share the shared input memory 708 among the ECC input memory 730 and failed codeword memory 750. Separately, the decoder system 701 is configured to dynamically share the shared output memory 605 among the ECC output memory 640, pair codeword memory 645, and track-based ECC output memory 665. For example, if there are not many failed codewords (e.g., few codewords belonging to the failed codeword memory 750), the decoder system 701 can allocate more memory to the ECC input memory 730 so that iteration-on-demand performs better. However, in this example, there is no sharing of memory between the shared input memory 708 and the shared output memory 605. Note that the shared input memory 708 and the shared output memory 605 can store different types of data, for example shared input memory 708 can store raw values corresponding to a sector, whereas shared output memory 605 can store values for a fully decoded sector. Typically, a fully decoded sector can require less memory to store than its corresponding raw signal representation.

FIG. 8 shows an architecture of an example of a decoder system 801 that allocates unused memory from an interleaver memory 805 to other types of memories. The decoder system 801 includes an interleaver 120, an interleaver memory 805, input memory 830, ECC decoder 135, track-based ECC decoder 155, track-based ECC scratch memory 840, and an output memory 850. The input memory 830 stores ECC input values and failed codewords. The output memory 850 stores ECC output, pair codeword, and track-based ECC output values. The decoder system 801 can allocate unused portions 810*a-c* of the interleaver memory 805. In this example, a first unused portion 810*a* is allocated to the input memory 830, a second unused portion 810*b* is allocated to the track-based ECC scratch memory 840, and a third unused portion 810*c* is allocated to the output memory 850.

The interleaver memory 805 can be manufactured to support interleaving up to M sectors. However, if sector interleaving does not show gain beyond N sectors, where N is less than M, the remaining memory within the interleaver memory 805 can be redistributed and allocated among the input memory 830, scratch memory 840, and output memory 850. In some implementations, if sector interleaving continues to provide gain with more sectors, (e.g., sector interleaving beyond M sectors), a portion of the input memory 830, output memory 850, and scratch memory 840 can be allocated to the interleaver memory 805. In some implementations, the decoder system 801 makes such allocations statically, e.g., does not change on-the-fly, since the size of the interleaver 120 must be determined before writing actual data. In some implementations, a SoC register can cause the decoder system 801 to divert interleaver memory 805 to other memories 830, 840, 850. In some implementations, a drive controller determines an optimum interleaver size by performing tests on an underlying storage medium and allocates memory accordingly.

FIG. 9 shows an architecture of an example of a decoder system 901 that includes a shared memory 905. The decoder system 901 includes a shared memory 905 that includes multiple memories 920*a-f* including an ECC input memory 920*a*, ECC output memory 920*b*, failed codeword memory 920*c*, pair codeword memory 920*d*, track-based ECC scratch memory 920*e*, and track-based ECC output memory 920*f*. The decoder system 901 includes an interleaver 120 and interleaver memory 125. Further, the decoder system 901 includes an ECC decoder 135, and a track-based ECC decoder 155. Except for the interleaver memory 125, the decoder system 901 is configured to dynamically share the shared memory 905 among the various types of memories 920*a-f*. Rather than having each of the memories 920*a-f* being assigned to a fixed amount of memory, the amount can dynamically vary on-the-fly.

FIG. 10 shows a flowchart of an example of operations performed by a controller of a storage system. For example, the operations illustrated in FIG. 10 can be performed by a controller such as controller 280 of FIG. 2. At 1005, the controller performs decoder processes, each of which is associated with a respective memory threshold, that require memory within a memory structure based on respective memory thresholds. In some implementations, a controller can allocate different memory segments within a memory structure for use by different decoder processes. At 1010, the controller determines whether any decoder process is underutilizing the memory structure. In some implementations, the controller tracks current decoder memory usage based on decoder memory type, e.g., ECC input/output, failed, pair, scratch, etc. Tracking current decoder memory usage can include incrementing a memory usage counter when writing a sector to a memory and decrementing the counter when the sector is no longer required to be stored within that memory. At periodic intervals, the controller compares the memory usage for each type of decoder memory to corresponding thresholds to detect underutilization. If underutilization is detected, the controller at 1015 determines an underutilization amount of the process with respect to the process's memory threshold. Determining an underutilization amount can include comparing a current memory allocation for a specific memory with the threshold for that specific memory. In some implementations, an underutilization amount represents a number of the banks that are free to be reassigned.

At 1020, the controller identifies another decoder process that would benefit from more memory. In some implementations, the controller identifies another decoder process that would benefit from more memory based on receiving a memory allocation request from a decoder process that exceeds the process's memory threshold. In some implementations, before failing such a memory allocation request, the controller performs the process of FIG. 10 to try to locate available memory from another decoder process.

At 1025, the controller enables the identified decoder process to exceed its memory threshold based on the underutilization amount to increase decoding performance of the identified decoder process. In some cases, the controller can reassign unused memory associated with the interleaver to the sector-based ECC decoder, the track-based ECC decoder, or both. In some cases, the controller can reassign unused memory associated with the sector-based ECC decoder to the track-based ECC decoder. In regard to a shared input memory, for example, if an ECC input memory is or is about to become full, the controller can determine whether to allocate memory to the ECC input memory from other input memory such as failed codeword memory. In some implementations, a memory reassignment includes adjusting a memory threshold.

In some implementations, a memory structure includes two or more banks. When accessing memory, a memory controller can specify which bank to access, and the address within the bank. In some implementations, a controller can assign the type of memory to each bank either statically or dynamically. A system, for example, may include 80 banks. A manufacturer can configure the controller to use one of several memory configurations, for example: (a) 32 banks for sector interleaving memory, 36 banks for input and failed memory, 4 banks for track-based ECC scratch memory, and 8 banks for output and pair memory; (b) 16 banks for sector interleaving memory, 48 banks for input and failed memory, 6 banks for track-based ECC scratch memory, and 10 banks for output and pair memory; (c) no memory for sector interleaving (sector interleaving is disabled), 60 banks for input and failed memory, 8 banks for track-based ECC scratch memory, and 12 banks for output and pair memory. In example memory configuration (a) above, to access a starting location of the input and failed memory, the controller can access the 33rd bank; note that banks 1-32 are assigned to interleaving, and the 33rd bank is the start of the input and failed memory group of banks.

In some implementations, during initialization, a controller can group the banks statically, such as one of the example memory configuration (a)-(c) given above. Within each group, e.g., input memory, the group is not divided into subgroups such as ECC input or failed memory. Suppose there are 36 banks for an input memory. All of these are empty at the initialization. As codewords come in, the decoder can write the codewords to the input memory, those written codewords come a part of the ECC input memory. When a decoder fails to recover a codeword, its ECC input memory can become a failed codeword memory. The controller can keep track of how many banks belong to each type, e.g., E banks for ECC input, F banks for failed, and X banks for empty, where E+F+X=36. A controller can detect memory underutilization. A controller can terminate the decoding of a codeword based on E, F, and X. For example, a controller may terminate decoding when E>THR−F/2, where THR is a configurable threshold parameter. This means that when there is no failed codeword (e.g., F=0, and underutilized), the controller can allow the ECC input memory to expand up to a certain size, e.g., expand by a THR amount. When the controller detects a failed codeword, the memory threshold on the ECC input memory can be reduced and the failed codeword memory can be increased. In some implementations, at the initialization, a controller can determine that the failed codeword memory is completely underutilized since there are no failed codewords due to no input signal having been received yet. As a result, the controller can increase the ECC input memory's threshold to be greater than a preset threshold. Based on detection of one or more failed codewords, the amount of underutilization is decreased, and the controller can reduce the memory threshold for the ECC input memory and increase the failed codeword memory.

A disk drive system can include a storage medium; circuitry configured to perform decoder processes in order to decode signals generated by reading the storage medium, the decoder processes being associated with respective memory thresholds; a memory structure coupled with the circuitry, the decoder processes using the memory structure in accordance with the respective memory thresholds; and a controller. The controller can be configured to detect whether the memory structure is underutilized by a process of the decoder processes, determine an underutilization amount associated with the process with respect to the memory threshold of the process, identify a target decoder process of the decoder processes, and enable the target decoder process to exceed the memory threshold of the target decoder process based on the underutilization amount to increase decoding performance.

In some implementations, the circuitry can include a sector-based error-correcting code decoder that produces first output sectors and a track-based error-correcting code decoder that produces second output sectors, where the memory structure can include a shared output memory that stores the first output sectors and the second output sectors, where a storage size for the first output sectors is controlled by a first memory threshold of the memory thresholds, and where a storage size for the second output sectors is controlled by a second memory threshold of the memory thresholds. In some implementations, a memory structure can include a shared input memory that stores input sectors and failed codewords, where a storage size for the input sectors is controlled by a third memory threshold of the memory thresholds, and where a storage size for the failed codewords is controlled by a fourth memory threshold of the memory thresholds.

In some implementations, circuitry can include an interleaver configured to reassemble a sector that is interleaved with one or more other sectors; a sector-based error-correcting code decoder that is configured to correct one or more errors of the sector based on parity data contained within the sector; and a track-based error-correcting code decoder that is configured to correct one or more errors within a group of sectors based on group parity data. In some implementations, a controller is configured to reassign unused memory associated with the interleaver to the sector-based error-correcting code decoder, the track-based error-correcting code decoder, or both.

In some implementations, a memory structure can include a shared input memory that stores input sectors and failed codewords, where a storage size for the input sectors is controlled by a first memory threshold of the memory thresholds, and where a storage size for the failed codewords is controlled by a second memory threshold of the memory thresholds, where the controller is configured to dynamically share memory within the shared input memory between storage for the input sectors and storage for the failed codewords.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

What is claimed is:

1. An apparatus comprising:
   a decoder system configured to perform decoder processes in order to decode signals generated by reading a storage medium, wherein the decoder processes are associated with respective memory thresholds; and
   a memory structure coupled with the decoder system, wherein the decoder processes use the memory structure in accordance with the respective memory thresholds,
   the decoder system comprises a sector-based error-correcting code decoder that produces first output sectors and a track-based error-correcting code decoder that produces second output sectors,
   the memory structure comprising:
      a shared output memory that stores the first output sectors and the second output sectors, wherein a storage size for the first output sectors is controlled by a first memory threshold of the memory thresholds, and wherein a storage size for the second output sectors is controlled by a second memory threshold of the memory thresholds; and
      a shared input memory that stores input sectors and failed codewords, wherein a storage size for the input sectors is controlled by a third memory threshold of the memory thresholds, and wherein a storage size for the failed codewords is controlled by a fourth memory threshold of the memory thresholds,
   wherein the decoder system is configured to i) detect whether the memory structure is underutilized by a process of the decoder processes, ii) determine an underutilization amount associated with the process with respect to the memory threshold of the process, iii) identify a target decoder process of the decoder processes, and iv) enable the target decoder process to exceed the memory threshold of the target decoder process based on the underutilization amount.

2. The apparatus of claim 1, wherein the sector-based error-correcting code decoder is configured to retrieve an input sector from the shared input memory, and wherein the track-based error-correcting code decoder is configured to retrieve a failed codeword from the shared input memory.

3. The apparatus of claim 1, wherein the decoder system further comprises:

an interleaver configured to reassemble a sector that is interleaved with one or more other sectors;
the sector-based error-correcting code decoder that is further configured to correct one or more errors of the sector based on parity data contained within the sector; and
the track-based error-correcting code decoder that is further configured to correct one or more errors within a group of sectors based on group parity data,
wherein the decoder system is configured to reassign unused memory associated with the interleaver to the sector-based error-correcting code decoder, the track-based error-correcting code decoder, or both.

4. The apparatus of claim 1, wherein the decoder system is configured to dynamically share memory within the shared input memory between storage for the input sectors and storage for the failed codewords.

5. The apparatus of claim 1, wherein the decoder system and the memory structure are integrated on a single integrated circuit.

6. The apparatus of claim 1, wherein the memory structure comprises banks, wherein each of the memory thresholds represents an assigned number of the banks, and wherein the underutilization amount represents a number of the banks that are free to be reassigned.

7. A method comprising:
performing decoder processes in order to decode signals generated by reading a storage medium, wherein the decoder processes are associated with respective memory thresholds, and wherein the decoder processes use a memory structure in accordance with the respective memory thresholds;
detecting whether the memory structure is underutilized by a process of the decoder processes;
determining an underutilization amount associated with the process with respect to the memory threshold of the process;
identifying a target decoder process of the decoder processes;
enabling the target decoder process to exceed the memory threshold of the target decoder process based on the underutilization amount;
operating an interleaver configured to reassemble a sector that is interleaved with one or more other sectors;
operating a sector-based error-correcting code decoder to correct one or more errors of the sector based on parity data contained within the sector;
operating a track-based error-correcting code decoder to correct one or more errors within a group of sectors based on group parity data; and
reassigning unused memory associated with the interleaver to the sector-based error-correcting code decoder, the track-based error-correcting code decoder, or both.

8. The method of claim 7, comprising:
operating a sector-based error-correcting code decoder to produce first output sectors, wherein a storage size for the first output sectors is controlled by a first memory threshold of the memory thresholds; and
operating a track-based error-correcting code decoder to produce second output sectors, wherein a storage size for the second output sectors is controlled by a second memory threshold of the memory thresholds, and
wherein the memory structure comprises a shared output memory that stores the first output sectors and the second output sectors.

9. The method of claim 8, wherein the memory structure comprises a shared input memory that stores input sectors and failed codewords, wherein a storage size for the input sectors is controlled by a third memory threshold of the memory thresholds, and wherein a storage size for the failed codewords is controlled by a fourth memory threshold of the memory thresholds.

10. The method of claim 9, comprising:
operating the sector-based error-correcting code decoder to retrieve an input sector from the shared input memory; and
operating the track-based error-correcting code decoder to retrieve a failed codeword from the shared input memory.

11. The method of claim 7, wherein the memory structure comprises a shared input memory that stores input sectors and failed codewords, wherein a storage size for the input sectors is controlled by a first memory threshold of the memory thresholds, and wherein a storage size for the failed codewords is controlled by a second memory threshold of the memory thresholds, and wherein the method comprises dynamically sharing memory within the shared input memory between storage for the input sectors and storage for the failed codewords.

12. The method of claim 7, wherein the memory structure comprises banks, wherein each of the memory thresholds represents an assigned number of the banks, and wherein the underutilization amount represents a number of the banks that are free to be reassigned.

13. A system comprising:
a storage medium;
circuitry configured to perform decoder processes in order to decode signals generated by reading the storage medium, wherein the decoder processes are associated with respective memory thresholds;
a memory structure coupled with the circuitry, wherein the decoder processes use the memory structure in accordance with the respective memory thresholds; and
a controller configured to i) detect whether the memory structure is underutilized by a process of the decoder processes, ii) determine an underutilization amount associated with the process with respect to the memory threshold of the process, iii) identify a target decoder process of the decoder processes, and iv) enable the target decoder process to exceed the memory threshold of the target decoder process based on the underutilization amount,
wherein the circuitry comprises:
an interleaver configured to reassemble a sector that is interleaved with one or more other sectors;
a sector-based error-correcting code decoder that is configured to correct one or more errors of the sector based on parity data contained within the sector; and
a track-based error-correcting code decoder that is configured to correct one or more errors within a group of sectors based on group parity data,
wherein the controller is configured to reassign unused memory associated with the interleaver to the sector-based error-correcting code decoder, the track-based error-correcting code decoder, or both.

14. The system of claim 13, wherein the circuitry comprises a sector-based error-correcting code decoder that produces first output sectors and a track-based error-correcting code decoder that produces second output sectors, wherein the memory structure comprises a shared output memory that stores the first output sectors and the second output sectors, wherein a storage size for the first output sectors is controlled by a first memory threshold of the memory thresholds, and wherein a storage size for the second output sectors is controlled by a second memory threshold of the memory thresholds.

15. The system of claim 14, wherein the memory structure comprises a shared input memory that stores input sectors and failed codewords, wherein a storage size for the input sectors is controlled by a third memory threshold of the memory thresholds, and wherein a storage size for the failed codewords is controlled by a fourth memory threshold of the memory thresholds.

16. The system of claim 13, wherein the memory structure comprises a shared input memory that stores input sectors and failed codewords, wherein a storage size for the Input sectors is controlled by a first memory threshold of the memory thresholds, and wherein a storage size for the failed codewords is controlled by a second memory threshold of the memory thresholds, wherein the controller is configured to dynamically share memory within the shared input memory between storage for the input sectors and storage for the failed codewords.

\* \* \* \* \*